United States Patent
Kim et al.

(10) Patent No.: US 9,658,522 B2
(45) Date of Patent: May 23, 2017

(54) REFLECTIVE EXTREME ULTRAVIOLET MASK

(71) Applicant: SAMSUNG ELECTRONICS CO., LTD., Suwon-si, Gyeonggi-do (KR)

(72) Inventors: Sang-Hyun Kim, Hwaseong-si (KR); Dong-Wan Kim, Seongnam-si (KR); Chang-Min Park, Hwaseong-si (KR); In-Sung Kim, Seongnam-si (KR); Dong-Gun Lee, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 112 days.

(21) Appl. No.: 14/814,763

(22) Filed: Jul. 31, 2015

(65) Prior Publication Data

US 2016/0154296 A1   Jun. 2, 2016

(30) Foreign Application Priority Data

Dec. 1, 2014   (KR) .................. 10-2014-0169462

(51) Int. Cl.
*G03F 1/24* (2012.01)

(52) U.S. Cl.
CPC .................... *G03F 1/24* (2013.01)

(58) Field of Classification Search
None
See application file for complete search history.

(56) References Cited

U.S. PATENT DOCUMENTS

| | | |
|---|---|---|
| 7,736,820 B2 | 6/2010 | Van Herpen et al. |
| 8,568,944 B2 | 10/2013 | Kim et al. |
| 2013/0177840 A1* | 7/2013 | Gabor ............... G03F 1/42 430/5 |
| 2013/0189608 A1 | 7/2013 | Oh et al. |
| 2013/0196255 A1 | 8/2013 | Hayashi |
| 2013/0236818 A1 | 9/2013 | Lee |
| 2014/0205936 A1 | 7/2014 | Kodera et al. |

FOREIGN PATENT DOCUMENTS

| | | |
|---|---|---|
| JP | 2013-074195 A | 4/2013 |
| JP | 2013-074202 A | 4/2013 |
| JP | 2013-206936 A | 10/2013 |
| KR | 10-0801484 B1 | 1/2008 |
| KR | 10-2012-0130890 A | 12/2012 |
| KR | 10-2013-0028173 A | 3/2013 |
| KR | 2014-0053357 A | 5/2014 |

\* cited by examiner

*Primary Examiner* — Stephen Rosasco
(74) *Attorney, Agent, or Firm* — Lee & Morse P.C.

(57) ABSTRACT

A reflective extreme ultraviolet (EUV) mask includes a mask substrate, a reflecting layer on an upper surface of the mask substrate, and an absorbing layer pattern on an upper surface of the reflecting layer, the absorbing layer pattern having an exposing region and a peripheral region, and the absorbing layer pattern including a grating pattern in the peripheral region to reduce reflectivity of light incident on the peripheral region.

14 Claims, 9 Drawing Sheets

REFLECTIVE EXTREME ULTRAVIOLET MASK

CROSS-REFERENCE TO RELATED APPLICATION

Korean Patent Application No. 10-2014-0169462, filed on Dec. 1, 2014, in the Korean Intellectual Property Office, and entitled: "Reflective Extreme Ultraviolet Mask and Method of Manufacturing the Same," is incorporated by reference herein in its entirety.

BACKGROUND

1. Field

Example embodiments relate to a reflective extreme ultraviolet (EUV) mask and a method of manufacturing the same. More particularly, example embodiments relate to a reflective EUV mask including a reflecting layer, and a method of manufacturing the reflective EUV mask.

2. Description of the Related Art

Recently, as a design rule of a semiconductor device is greatly reduced, a wavelength of light used in an exposure process may be decreased. For example, as a pattern having a desired minute width may not be formed using light such as an I-line, a G-line, a KrF, an ArF, etc., an extreme ultraviolet (EUV) light having a short wavelength may be used in the exposure process. However, because most materials may absorb the EUV light due to an atomic resonance, a reflective mask, rather than a transmissive mask, may be used in the exposure process.

The reflective EUV mask may include a mask substrate, a reflecting layer formed on the mask substrate. and an absorbing layer pattern formed on the reflecting layer. A peripheral region corresponding to an edge region of the absorbing layer pattern of the reflective EUV mask may not be used in an exposure process.

SUMMARY

Example embodiments provide a reflective EUV mask capable of decreasing reflectivity.

Example embodiments also provide a method of manufacturing the above-mentioned reflective EUV mask.

According to some example embodiments, there may be provided a reflective

EUV mask. The reflective EUV mask may include a mask substrate, a reflecting layer and an absorbing layer pattern. The reflecting layer may be formed on an upper surface of the mask substrate. The absorbing layer pattern may be formed on an upper surface of the reflecting layer. The absorbing layer pattern may include an exposing region and a peripheral region. The absorbing layer pattern may include a grating pattern formed in the peripheral region to decrease a reflectivity of a light incident to the peripheral region.

In example embodiments, the grating pattern may include a plurality of openings configured to expose the upper surface of the reflecting layer.

In example embodiments, the grating pattern may be configured to decrease reflectivities of an extreme ultraviolet (EUV) and a deep ultraviolet (DUV).

In example embodiments, the absorbing layer pattern may include an EUV absorbing layer pattern formed on the reflecting layer, and a DUV absorbing layer pattern formed on the EUV absorbing layer pattern.

In example embodiments, the absorbing layer pattern in the exposing region may include an exposing pattern.

In example embodiments, the reflecting layer may include a molybdenum layer and a silicon layer alternately stacked.

According to some example embodiments, there may be provided a reflective EUV mask. The reflective EUV mask may include a mask substrate, a reflecting layer and an absorbing layer pattern. The reflecting layer may be formed on an upper surface of the mask substrate. The reflecting layer may include a molybdenum layer and a silicon layer alternately stacked. The absorbing layer pattern may include an EUV absorbing layer pattern formed on the reflecting layer, and a DUV absorbing layer pattern formed on the EUV absorbing layer pattern. The absorbing layer pattern may include an exposing region and a peripheral region. The absorbing layer pattern may include a grating pattern formed in the peripheral region to decrease reflectivities of the EUV and the DUV incident to the peripheral region.

In example embodiments, the grating pattern may include a plurality of openings formed through the EUV absorbing layer pattern and the DUV absorbing layer pattern to expose the upper surface of the reflecting layer.

In example embodiments, the absorbing layer pattern in the exposing region may include an exposing pattern.

According to some example embodiments, there may be provided a method of manufacturing a reflective EUV mask. In the method of manufacturing the reflective EUV mask. a reflecting layer may be formed on an upper surface of a mask substrate. An absorbing layer may be formed on an upper surface of the reflecting layer. The absorbing layer may include an exposing region and a peripheral region. The absorbing layer pattern in the peripheral region may be etched to form a grating pattern configured to decrease a reflectivity of a light incident to the peripheral region. The absorbing layer in the exposing region may be etched to form an absorbing layer pattern including an exposing pattern.

In example embodiments, the grating pattern may be formed simultaneously with the exposing pattern.

In example embodiments, the grating pattern may be formed before forming the exposing pattern.

In example embodiments, forming the grating pattern may include forming a plurality of openings through the absorbing layer in the peripheral region to expose the upper surface of the reflecting layer.

In example embodiments, forming the absorbing layer may include forming an EUV absorbing layer on the reflecting layer, and forming a DUV absorbing layer on the EUV absorbing layer pattern.

In example embodiments, the absorbing layer pattern may be formed by a plasma etching process.

According to some example embodiments, there may be provided a reflective EUV mask, including a mask substrate, a reflecting layer on an upper surface of the mask substrate, and an absorbing layer pattern on an upper surface of the reflecting layer. the absorbing layer pattern having an exposing pattern in an exposing region, and a grating pattern in a peripheral region, the grating pattern having a same height as the exposing pattern.

In example embodiments, openings in the grating pattern may be smaller than openings in the exposing pattern.

In example embodiments, the grating pattern may include same layers as the exposing pattern.

In example embodiments, the grating pattern may extend to an outermost edge of the mask substrate, the grating pattern surrounding the exposing pattern.

In example embodiments, the grating pattern may be separated from the exposing pattern by an opening.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Various example embodiments will be described more fully hereinafter with reference to the accompanying drawings, in which some example embodiments are shown. The present disclosure may, however, be embodied in many different forms and should not be construed as limited to the example embodiments set forth herein. Rather, these example embodiments are provided so that this disclosure will be thorough and complete, and will fully convey the scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected, or coupled to the other element or layer, or intervening elements or layers may be present. In addition, it will also be understood that when a layer or element is referred to as being "between" two layers or elements, it can be the only layer or element between the two layers or elements, or one or more intervening layers or elements may also be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present disclosure.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Reflective EUV Mask

Figure 1:
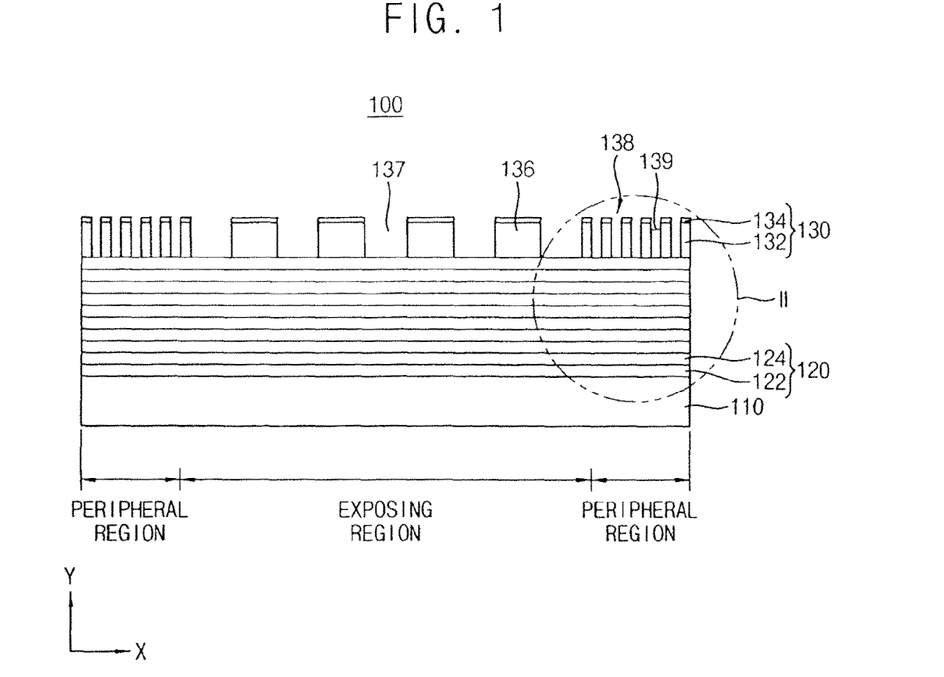
FIG. 1 illustrates a cross-sectional view of a reflective EUV mask in accordance with example embodiments.
Figure 2:
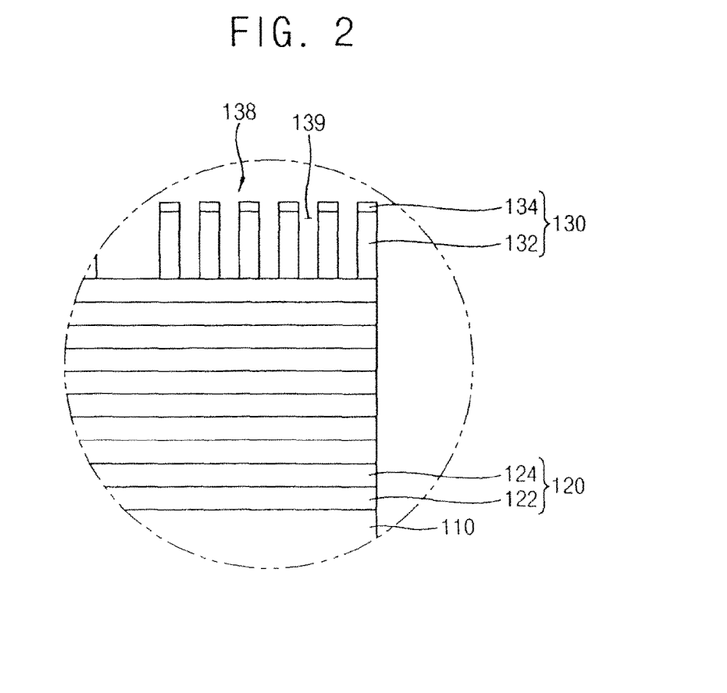
FIG. 2 illustrates an enlarged cross-sectional view of a portion "II" in FIG. 1.

FIG. 1 is a cross-sectional view of a reflective EUV mask in accordance with example embodiments. FIG. 2 is an enlarged cross-sectional view of a portion "II" in FIG. 1, and FIG. 3 is a plan view of the reflective EUV mask in FIG. 1.

Figure 3:
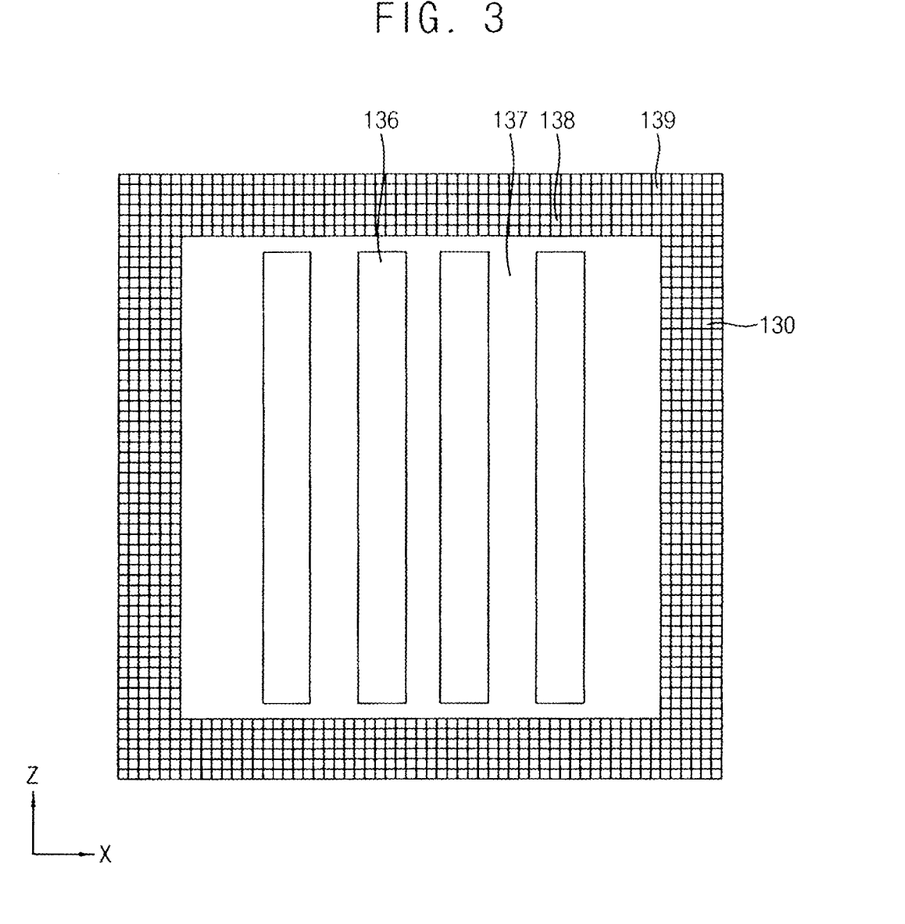
FIG. 3 illustrates a plan view of the reflective EUV mask in FIG. 1.

Referring to FIGS. 1 to 3, a reflective EUV mask 100 of this example embodiment may include a mask substrate 110, a reflecting layer 120, and an absorbing layer pattern 130.

The mask substrate 110 may have an exposing region and a peripheral region. The mask substrate 110 may have a rectangular parallelepiped shape. The exposing region may be positioned at a central portion of the mask substrate 110. The peripheral region may be positioned at an edge portion of the mask substrate 110 to, e.g., completely, surround the exposing region. The mask substrate 110 may include. e.g., quartz, glass, Ti-doped fused silica, etc.

The reflecting layer 120 may be formed on an upper surface of the mask substrate 110. The reflecting layer 120 may include molybdenum layers 122 and silicon layers 124 alternately stacked. The reflecting layer 120 may reflect EUV light incident on the reflective EUV mask 100 in an exposure process.

The absorbing layer pattern 130 may be formed on an upper surface of the reflecting layer 120, e.g., the reflecting layer 120 may be between the mask substrate 110 and the absorbing layer pattern 130. The absorbing layer pattern 130 may include, e.g., chromium. The absorbing layer pattern 130 may have an exposing region and a peripheral region corresponding to the exposing region and the peripheral region of the mask substrate 110, respectively.

The absorbing layer pattern 130 in the exposing region may include an exposing pattern 136. The exposing pattern 136 may have a plurality of openings 137 configured to expose the upper surface of the reflecting layer 120. The EUV light may be incident on the reflecting layer 120 through the openings of the absorbing layer pattern 130.

The absorbing layer pattern 130 in the peripheral region may include a grating pattern 138, e.g., the grating pattern 138 may be positioned only in the peripheral region of the absorbing layer pattern 130. The grating pattern 138 may include a plurality of openings 139 configured to expose the upper surface of the reflecting layer 120. For example, as illustrated in FIGS. 1-2, the grating pattern 138 may include the same layers as the exposing pattern 136, and a top surface of the grating pattern 138 may be substantially level with a top surface of the exposing pattern 136.

For example, as illustrated in FIG. 3, each of the openings 139 may have a quadrangular, e.g., square, shape in plan view. For example, if the peripheral region of the absorbing layer pattern 130 has a quadrangular frame shape that surrounds the exposing pattern 136, a plurality of openings 139 may be arranged along each of the x-axis and the z-axis in a matrix pattern in each side of the quadrangular frame (FIG. 3). For example, as illustrated in FIGS. 1-3, a width of each opening 139 along the x-axis may be substantially smaller than a width of each opening 137 along the x-axis. For example, as illustrated in FIG. 3, a length of each opening 139 along the z-axis may be substantially smaller than a length of each opening 137 along the z-axis.

The grating pattern 138 scatters the EUV light and the DUV light incident thereon, i.e., on the peripheral region of the absorbing layer pattern 130. As the grating pattern 138 scatters, e.g., removes, at least primarily diffracted DUV light, reflection of the DUV light from the absorbing layer pattern 130 in the peripheral region may be prevented or substantially minimized.

The absorbing layer pattern 130 may include an EUV absorbing layer pattern 132 on the reflecting layer 120, and a DUV absorbing layer pattern 134 on the EUV absorbing layer pattern 132. The openings 139 may be formed through the EUV absorbing layer pattern 132 and the DUV absorbing layer pattern 134 in the peripheral region to expose the upper surface of the reflecting layer 120. Alternatively, the absorbing layer pattern 130 may include a single layer.

Method of Manufacturing a Reflecting EUV Mask

FIGS. 4 to 7 are cross-sectional views illustrating a method of manufacturing the reflecting EUV mask in FIG. 1 in accordance with example embodiments.

Figure 4:
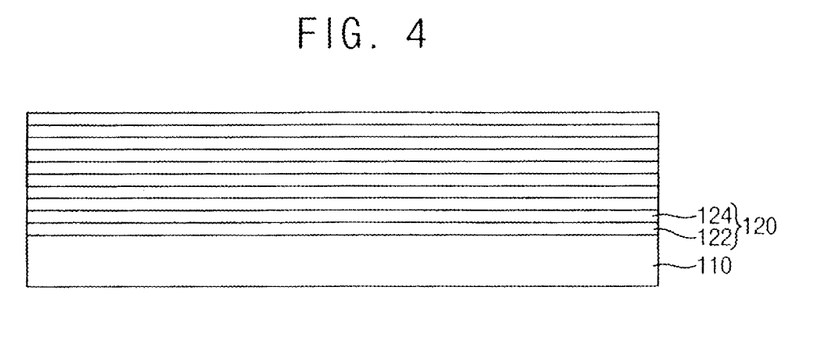
FIGS. 4 to 7 illustrate cross-sectional views of stages in a method of manufacturing the reflecting EUV mask in FIG. 1 in accordance with example embodiments.

Referring to FIG. 4, the reflecting layer 120 may be formed on the upper surface of the mask substrate 110. The mask substrate 110 may have the exposing region and the peripheral region. The exposing region may be located at the central portion of the mask substrate 110. The peripheral region may be located at the edge portion of the mask substrate 110 to surround the exposing region.

For example, the reflecting layer 120 may include the molybdenum layers 122 and the silicon layers 124 alternately stacked. In another example, the reflecting layer 120 may include other and/or additional layers in place of the molybdenum layers 122 and the silicon layers 124. As illustrated in FIG. 4, the reflecting layer 120 may cover both the exposing and peripheral regions of the mask substrate 110.

Figure 5:
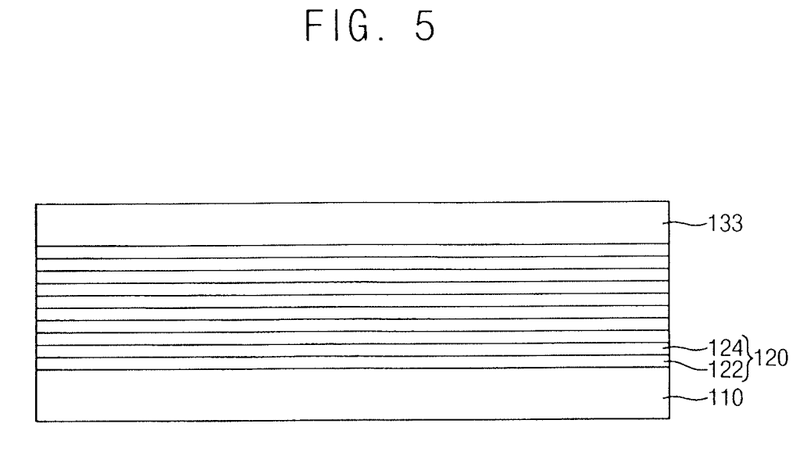

Referring to FIG. 5, an EUV absorbing layer 133 may be formed on the upper surface of the reflecting layer 120. For example, as illustrated in FIG. 5, the EUV absorbing layer 133 may uniformly cover, i.e., to a same thickness, both the exposing and peripheral regions of the mask substrate 110.

Figure 6:
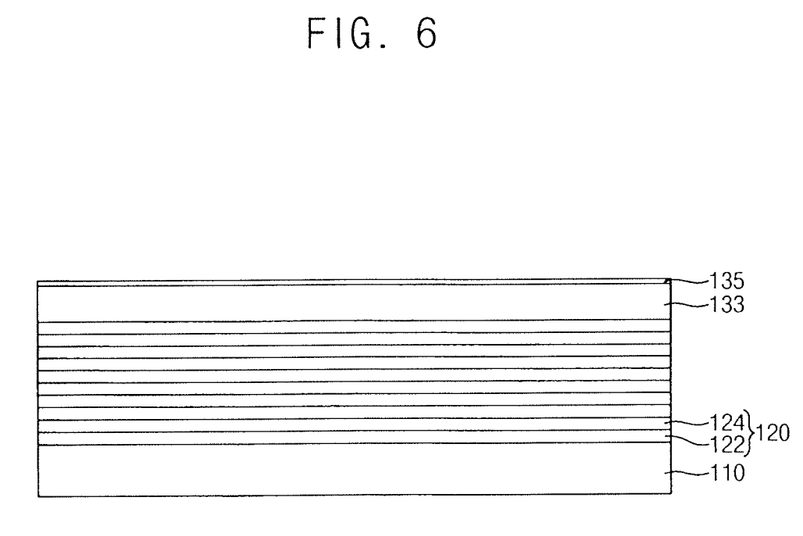

Referring to FIG. 6, a DUV absorbing layer 135 may be formed on an upper surface of the EUV absorbing layer 133. For example, as illustrated in FIG. 6, the DUV absorbing layer 135 may uniformly cover, i.e., to a same thickness, both the exposing and peripheral regions of the mask substrate 110.

Figure 7:
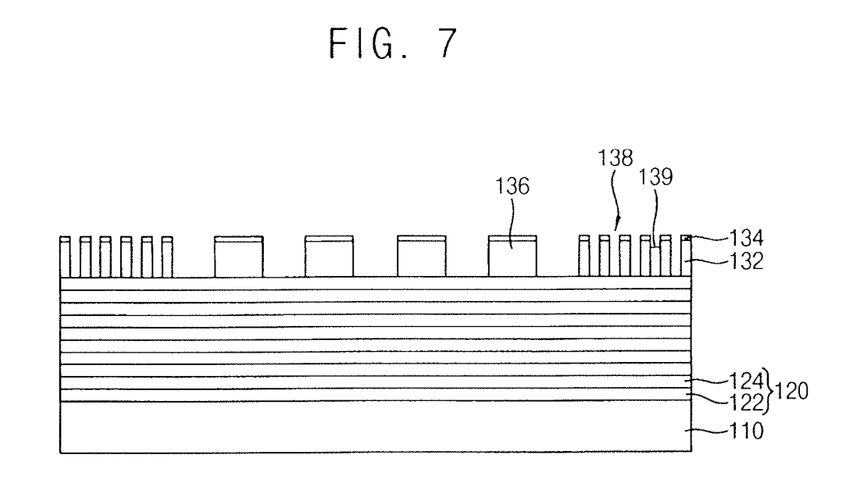

Referring to FIG. 7, a photoresist pattern may be formed on an upper surface of the DUV absorbing layer 135. The DUV absorbing layer 135 and the EUV absorbing layer 133 may be etched using the photoresist pattern as an etch mask to form the DUV absorbing layer pattern 134 and the EUV absorbing layer pattern 132. The EUV absorbing layer pattern 132 and the DUV absorbing layer pattern 134 in the exposing region may correspond to the exposing pattern 136. The grating pattern 138 may be formed in the peripheral region of the absorbing layer pattern 130. That is, the EUV absorbing layer pattern 132 and the DUV absorbing layer pattern 134 in the peripheral region may correspond to the grating pattern 138. Thus, the exposing pattern 136 and the grating pattern 138 may be simultaneously formed by the single etch process. The DUV absorbing layer pattern 134 and the EUV absorbing layer pattern 132 may be formed by a plasma etch process.

Figure 8:
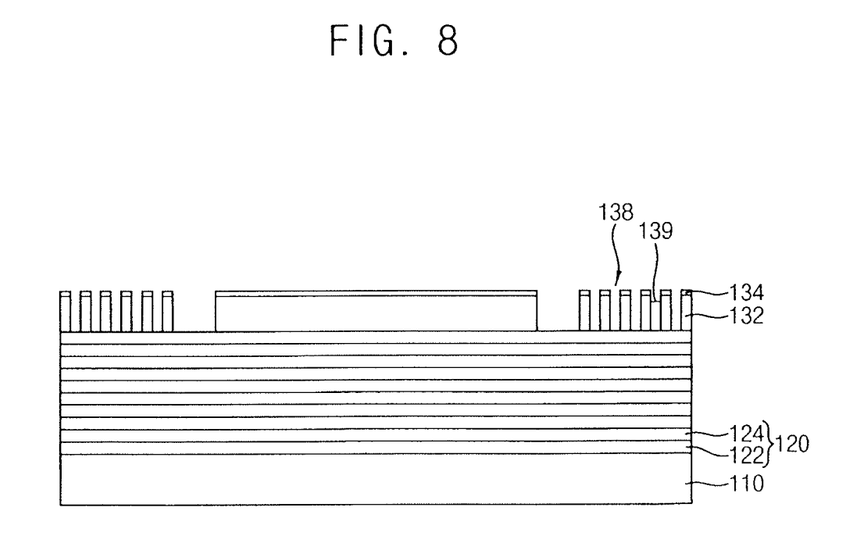
FIGS. 8 and 9 illustrate cross-sectional views of stages in a method of manufacturing the reflecting EUV mask in FIG. 1 in accordance with other example embodiments.
Figure 9:
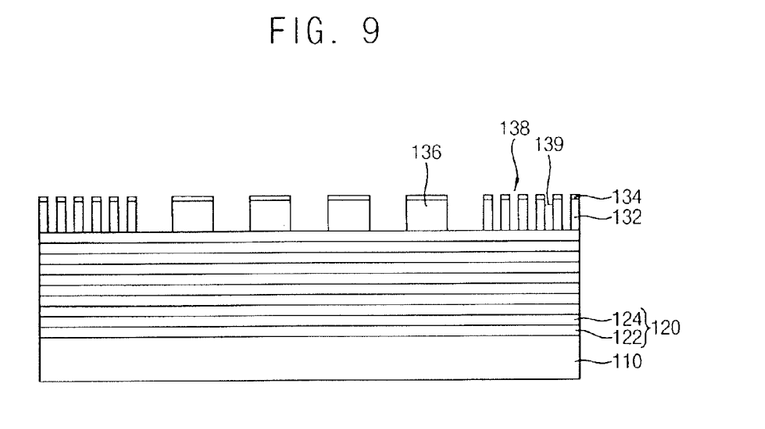

FIGS. 8 and 9 are cross-sectional views illustrating a method of manufacturing the reflecting EUV mask in FIG. 1 in accordance with other example embodiments.

Processes substantially the same as the processes described with reference to FIGS. 4 to 6 may be performed to sequentially form the reflecting layer 120, the EUV absorbing layer 133, and the DUV absorbing layer 135 on the upper surface of the mask substrate 110.

Referring to FIG. 8, a first photoresist pattern may be formed on, e.g., above, an upper surface of the DUV absorbing layer 135. The DUV absorbing layer 135 and the EUV absorbing layer 133 only in the peripheral region may be etched using the first photoresist pattern as an etch mask to form the grating pattern 138. The grating pattern 138 may be formed by a plasma etch process. The first photoresist pattern may be removed by an asking process and/or a stripping process.

Referring to FIG. 9, a second photoresist pattern may be formed on an upper surface of the DUV absorbing layer 135. The DUV absorbing layer 135 and the EUV absorbing layer 133 in the exposing region may be etched using the second photoresist pattern as an etch mask to form the DUV absorbing layer pattern 134 and the EUV absorbing layer pattern 132. The EUV absorbing layer pattern 132 and the DUV absorbing layer pattern 134 in the exposing region may correspond to the exposing pattern 136. Thus, the exposing pattern 136 may be formed after forming the grating pattern 138. The DUV absorbing layer pattern 134 and the EUV absorbing layer pattern 132 may be formed by a plasma etch process.

Measuring Reflectivities of Reflective EUV Masks

The same light was irradiated toward the reflective EUV mask in FIG. 1 and toward a comparative reflective EUV mask, i.e., a reflective EUV mask without a grating pattern. Reflectivity of the reflective EUV mask in FIG. 1 and reflectivity of the comparative reflective EUV mask were measured.

Figure 10:
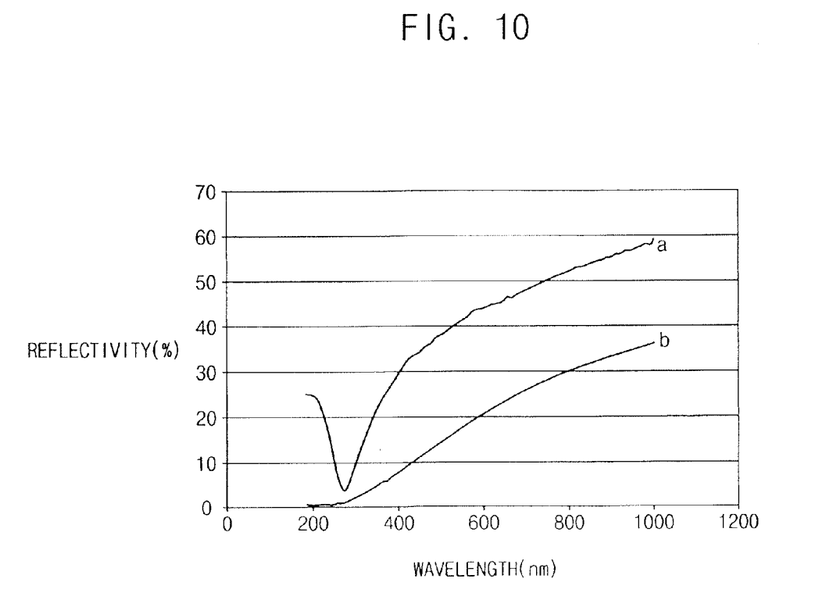
FIG. 10 is a graph of reflectivity of the reflective EUV mask in FIG. 1 and reflectivity of a reflective mask without a grating pattern.

FIG. 10 is a graph showing the measured reflectivity of the reflective EUV mask in FIG. 1 and the reflectivity of the comparative reflective EUV mask. In FIG. 10, a horizontal axis represents a wavelength, and a vertical axis represents a reflectivity. A curved line "a" represents the reflectivity of the comparative reflective EUV mask, and a curved line "b" represents the reflectivity of the reflective EUV mask in FIG. 1.

As shown in FIG. 10, the reflective EUV mask with the grating pattern in FIG. 1 (curve "b") has a substantially lower reflectivity than that of the comparative reflective EUV mask (curve "a") along a wavelength range of 200 nm to 1000 nm. Thus, it can be noted that the grating pattern 138 formed at the peripheral region of the absorbing layer pattern 130 decreases the reflectivity of the DUV.

Measuring Critical Dimensions (CD) of Patterns on a Semiconductor Substrate

Figure 11:
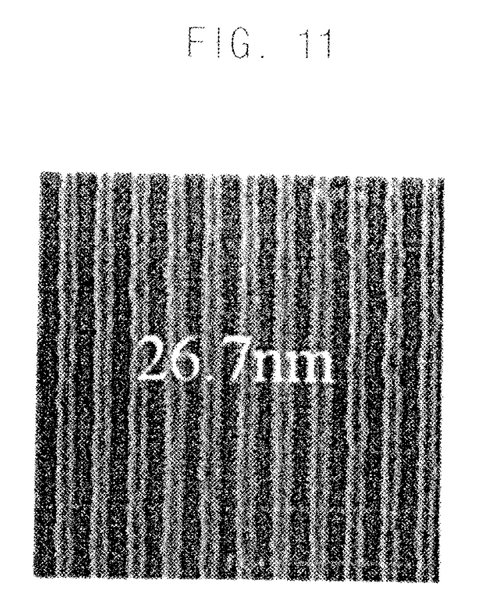
FIGS. 11 to 13 are photographs of critical dimensions (CD) of patterns of a semiconductor substrate formed by an exposure process using the reflective EUV mask in FIG. 1 and a reflective EUV mask without the grating pattern.
Figure 12:
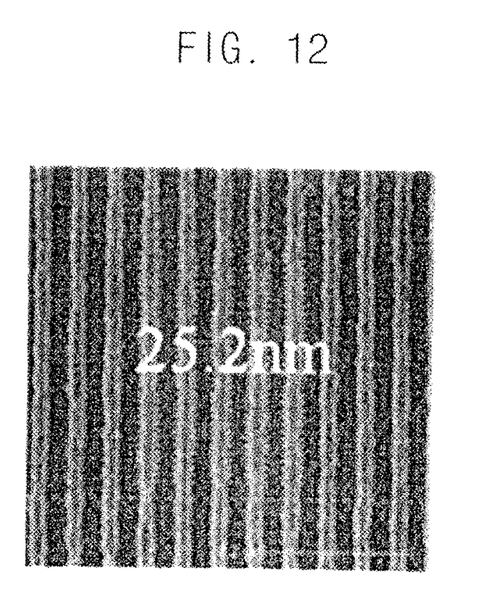
Figure 13:
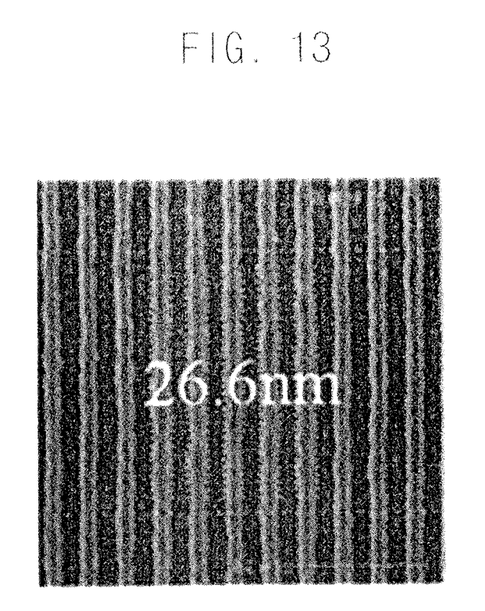

FIGS. 11 to 13 are photographs illustrating critical dimensions (CD) of patterns of a semiconductor substrate formed by an exposure process using the reflective EUV mask in FIG. 1 and the comparative reflective EUV mask used with reference to FIG. 10. FIG. 11 shows a reference CD of a designed pattern, FIG. 12 shows a CD of a pattern formed using the comparative reflective EUV mask, and FIG. 13 shows a CD of a pattern formed using the reflective EUV mask with the grating pattern in FIG. 1.

As shown in FIGS. 11 to 13, the reference CD of the designed pattern is about 26.7 nm. However, the CD of the pattern formed using the comparative reflective EUV mask is about 25.2 nm. Thus, it can be noted that the CD of the pattern formed using the comparative reflective EUV mask is decreased by about 1.5 nm as compared to the reference CD. In contrast, the CD of the pattern formed using the reflective EUV mask with the grating pattern in FIG. 1 is about 26.6 nm. Thus, it can be noted that the CD of the pattern formed using the reflective EUV mask with the grating pattern in FIG. 1 is almost equal to the reference CD. As a result, the CD of the pattern formed using the reflective EUV mask with the grating pattern in FIG. 1 is maintained by reducing the reflectivity of the DUV in the reflective EUV mask in FIG. 1.

Forming a Pattern using the Reflective EUV mask

Figure 14:
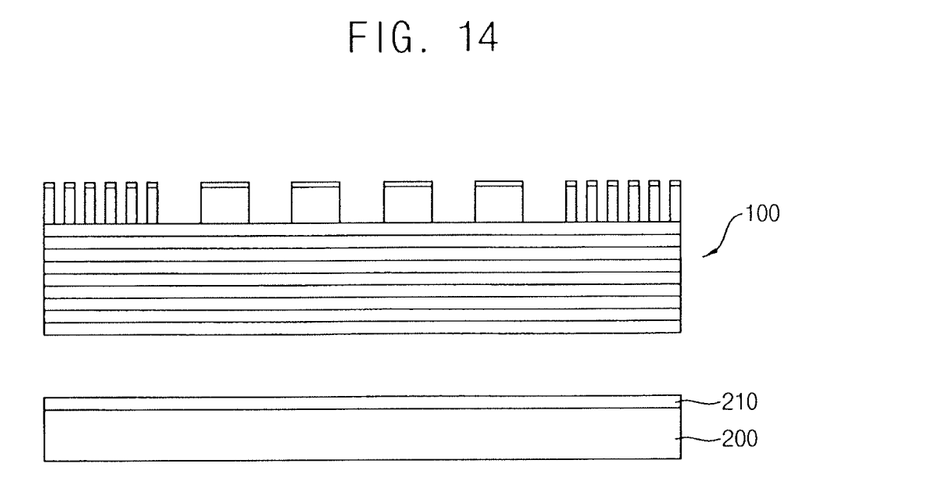
FIGS. 14 to 16 illustrate cross-sectional views of stages in a method of forming a pattern in a semiconductor substrate using the reflective EUV mask in FIG. 1.
Figure 15:
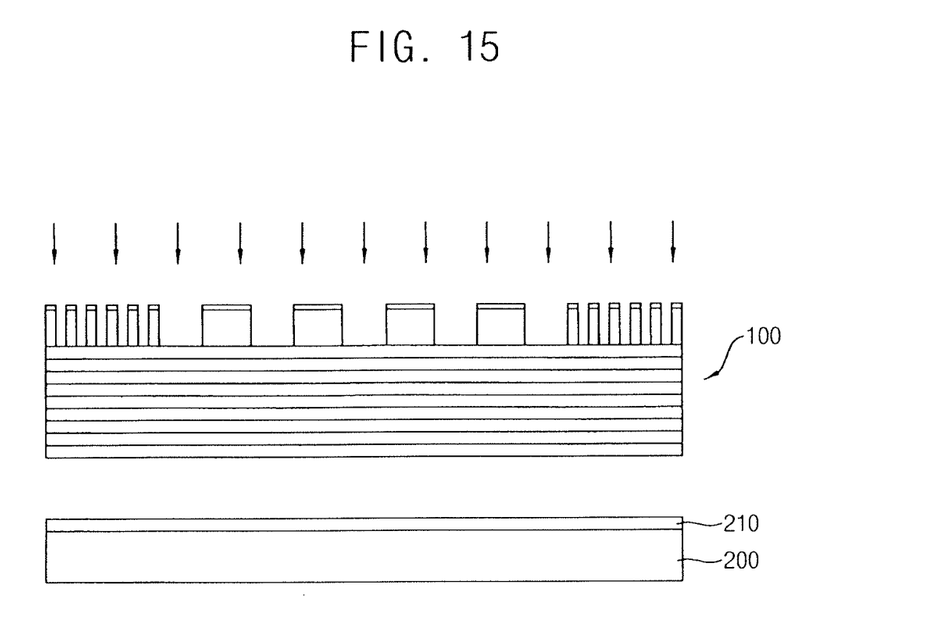
Figure 16:
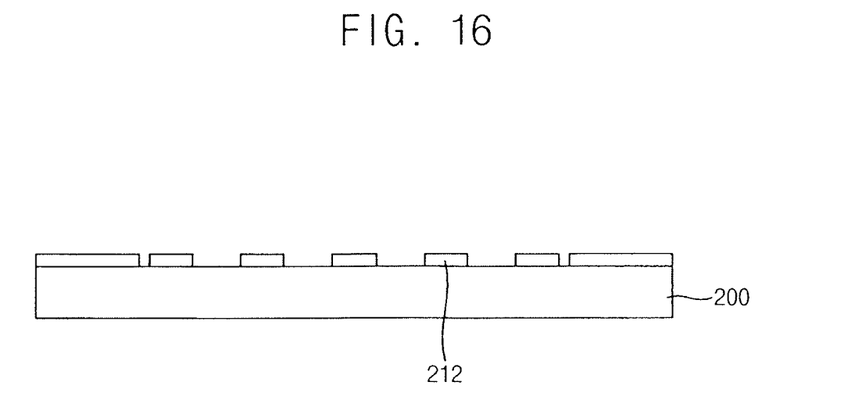

FIGS. 14 to 16 are cross-sectional views of stages in a method of forming a pattern in a semiconductor substrate using the reflective EUV mask in FIG. 1.

Referring to FIG. 14, a layer 210 may be formed on an upper surface of a semiconductor substrate 200. The reflective EUV mask 100 of FIG. 1 may be arranged over the layer 210.

Referring to FIG. 15, EUV light may be irradiated toward the reflective EUV mask 100. The EUV light may be incident on the layer 210 through the openings of the exposing pattern 136 in the exposing region to expose the layer 210. In contrast, the DUV light incident on the peripheral region of the absorbing layer pattern 130 may be almost not reflected from the absorbing layer pattern 130 in the peripheral region by the grating pattern 138. Thus, interference between the EUV light incident on the exposing region and the DUV light incident on the peripheral region may be suppressed.

Referring to FIG. 16, a developing process may be performed on the exposed layer 210 to form a pattern 212 on the upper surface of the semiconductor substrate 200. Because the pattern 212 may be formed using EUV light that does not interfere with the DUV light incident on the peripheral region, the pattern 212 may have a designed CD.

By way of summation and review, a light source of an EUV scanner irradiating EUV light at a predetermined wavelength toward a reflective EUV mask may include an out-of-band wavelength in addition to the predetermined wavelength, e.g., a DUV light having a wavelength of about 100 nm to about 300 nm that may not be completely removed. However, as an absorbing layer of the reflective EUV mask may have high reflectivity with respect to the DUV light, a large amount of the DUV light may be reflected from an edge portion. e.g. a black border, of the reflective EUV mask. As such, the reflected DUV light may cause light interference with the EUV light, so that a desired photoresist pattern may not be accurately formed, e.g., affect an adjacent shot to generate an overlay error or an image deterioration, etc.

In contrast, according to example embodiments, the reflective EUV mask includes a grating pattern in the peripheral region of the absorbing layer pattern. The grating pattern scatters light incident thereon, thereby decreasing reflectivity of light therefrom, e.g., the DUV light incident on the peripheral region. Thus, a desired photoresist pattern may be accurately formed using the reflective EUV mask so that a desired pattern may be obtained.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A reflective extreme ultraviolet (EUV) mask, comprising:
    a mask substrate;
    a reflecting layer on an upper surface of the mask substrate; and
    an absorbing layer pattern on an upper surface of the reflecting layer, the absorbing layer pattern having an exposing region and a peripheral region, and the absorbing layer pattern including a grating pattern in the peripheral region to reduce reflectivity of light incident on the peripheral region.

2. The reflective EUV mask as claimed in claim 1, wherein the grating pattern has a plurality of openings to expose the upper surface of the reflecting layer.

3. The reflective EUV mask as claimed in claim 1, wherein the grating pattern reduces reflectivity of deep ultraviolet (DUV) light.

4. The reflective EUV mask as claimed in claim 1, wherein the absorbing layer pattern includes:

an EUV absorbing layer pattern on the upper surface of the reflecting layer; and a DUV absorbing layer pattern on an upper surface of the EUV absorbing layer pattern.

5. The reflective EUV mask as claimed in claim 1, wherein the absorbing layer pattern in the exposing region includes an exposing pattern.

6. The reflective EUV mask as claimed in claim 1, wherein the reflecting layer includes alternately stacked molybdenum layers and silicon layers.

7. A reflective extreme ultraviolet (EUV) mask, comprising:

a mask substrate;

a reflecting layer on an upper surface of the mask substrate, the reflecting layer including alternately stacked molybdenum layers and silicon layers; and an absorbing layer pattern including an EUV absorbing layer pattern on the upper surface of the reflecting layer and a DUV absorbing layer pattern on an upper surface of the EUV absorbing layer pattern, the absorbing layer pattern having an exposing region and a peripheral region, and the absorbing layer pattern including a grating pattern in the peripheral region to reduce reflectivity of deep ultraviolet (DUV) light incident on the peripheral region.

8. The reflective EUV mask as claimed in claim 7, wherein the grating pattern has a plurality of openings through the EUV absorbing layer pattern and the DUV absorbing layer pattern to expose the upper surface of the reflecting layer.

9. The reflective EUV mask as claimed in claim 7, wherein the absorbing layer pattern in the exposing region includes an exposing pattern.

10. A reflective extreme ultraviolet (EUV) mask, comprising:

a mask substrate;

a reflecting layer on an upper surface of the mask substrate; and an absorbing layer pattern on an upper surface of the reflecting layer, the absorbing layer pattern including:

an exposing pattern in an exposing region, and a grating pattern in a peripheral region, the grating pattern having a same height as the exposing pattern.

11. The reflective EUV mask as claimed in claim 10, wherein openings in the grating pattern are smaller than openings in the exposing pattern.

12. The reflective EUV mask as claimed in claim 10, wherein the grating pattern includes same layers as the exposing pattern.

13. The reflective EUV mask as claimed in claim 10, wherein the grating pattern extends to an outermost edge of the mask substrate, the grating pattern surrounding the exposing pattern.

14. The reflective EUV mask as claimed in claim 10, wherein the grating pattern is separated from the exposing pattern by an opening.

* * * * *